United States Patent [19]
Hagerty et al.

[11] Patent Number: 5,176,307
[45] Date of Patent: Jan. 5, 1993

[54] WAVE SOLDERING IN A PROTECTIVE ATMOSPHERE ENCLOSURE OVER A SOLDER POT

[75] Inventors: Lawrence J. Hagerty; Mark S. Nowotarski, both of Stamford, Conn.; David A. Diamantopoulous, Ringwood, N.J.

[73] Assignee: Praxair Technology, Inc., Danbury, Conn.

[21] Appl. No.: 660,415

[22] Filed: Feb. 22, 1991

[51] Int. Cl.⁵ .............................. B23K 3/00; B23K 3/08
[52] U.S. Cl. ........................................ 228/37; 228/42; 118/DIG. 7
[58] Field of Search .................. 228/37, 42, 56.1, 56.2, 228/219, 105, 180.1; 98/115.3; 118/718, 733, 326, DIG. 7; 427/432

[56] References Cited

U.S. PATENT DOCUMENTS

| | | | |
|---|---|---|---|
| 2,082,622 | 6/1937 | Fink | 427/432 |
| 4,254,158 | 3/1981 | Fukuzuka et al. | 427/432 |
| 4,538,757 | 9/1985 | Bertiger | 228/180.1 |
| 4,606,493 | 8/1986 | Christoph et al. | 228/180.1 |
| 4,610,391 | 9/1986 | Nowotarski | 228/219 |
| 4,821,947 | 4/1989 | Nowotarski | 228/219 |
| 4,921,156 | 5/1990 | Hohnerlein | 228/37 |
| 5,044,542 | 9/1991 | Deambrosio | 228/37 |
| 5,048,746 | 9/1991 | Elliott et al. | 228/37 |

FOREIGN PATENT DOCUMENTS 2243 1/1979 Japan.

OTHER PUBLICATIONS

"Fluxless Soldering With Nitrogen" by M. Nowotarski, in Proceedings of the Technical Program, NEPCON, Feb. 26, 1990, pp. 459-472.
Soldering in Electronics, pp. 234-235 and pp. 496-539 by Wassink & Klein. 1984.
Preliminary Engineering Data Sheet GS 193 by the Dover Soltec Company, Jan. 5, 1989.
"No Fluxing, No Cleaning: Inert Gas Wave Soldering" by G. Schouten in *Circuits Manufacturing*, Sep. 1989, pp. 51-53.
"Benefits of Cover Gas Soldering", by P. Foder, Nov. 30, 1989, pp. 482-493.
Description and General Information of Nitrogenius Cover Gas Soldering System manufactured by Seitz & Hohnerlein, 1990, pp. 1-16.
"The Effect of a Nitrogen Atmosphere On the Wave Tinning of Component Leads," by Nowotarski et al, Feb. 25, 1986.
The Clean Alternative-Inert Gas Wave Soldering Without Acid Dopes by R. A. Troyato & M. Van Schaik. Sep. 26, 1990.
Sales brochure entitled Seho Lotanlagen Soldering Systems For The Future, 12 pages.

*Primary Examiner*—Samuel M. Heinrich
*Attorney, Agent, or Firm*—Peter Kent

[57] ABSTRACT

A short hood for enclosing and providing a protective atmosphere over not more than the solder pot of a machine for wave soldering printed circuit boards. Other operative areas of the machine are exposed to air. The entrance and exit openings to the hood for the circuit boards are covered by electrically conductive curtains of thin material cut into vertical strips. The process employs a thin layer of no-clean flux and allows up to 5% oxygen content in the protective atmosphere.

11 Claims, 5 Drawing Sheets

WAVE SOLDERING IN A PROTECTIVE ATMOSPHERE ENCLOSURE OVER A SOLDER POT

TECHNICAL FIELD

This invention pertains to a wave soldering machine and process for producing soldered connections on a printed circuit board carrying electronic components.

BACKGROUND

Wave soldering is a common method of forming solder joints between electronic components and circuit traces on a printed circuit board. Electronic components are placed on a circuit board and their leads are inserted into holes in the circuit board so that the leads touch the metal pads to which they are to be soldered. The components may be glued to the circuit board to retain them during the soldering process.

With the components in place, an applicator applies flux to the bottom of the board in the form of a spray, a foam or a wave. Flux allows soldering of metallic materials with poor wetability and solderability, such as oxidized copper. Flux also allows solder to fill metallized holes in the board more readily.

The fluxed board is preheated to dry and activate the flux and to thermally prepare the board to contact the molten solder with low thermal stress. The activated flux reacts with metal oxides on the component leads and the circuit board pads and dissolves the oxides. The presence of oxygen as in air has been thought to be deleterious in the preheat operation since oxygen produces metal oxides.

The bottom of the fluxed, preheated board is contacted with molten solder either in a static bath or in a pumped wave so as to wet the parts to be coated or joined with solder. Upon detachment of the board from the solder bath, a coating of solder remains on the wetted parts. The adhering solder solidifies, forming electrically conductive joints and coatings.

After soldering, the board is usually cleaned to remove the remaining flux and flux residues, which can cause corrosion, unwanted electrical conduction, poor appearance and interference with subsequent testing. Cleaning, however, is desirably eliminated since it is expensive and cleaning fluids are environmentally objectionable. Subsequent inspection or testing determines what connections, desired and undesired, have been made by the solder. The testing is usually performed by an array of pins brought into contact with the board pads and through which electrical measurements are made.

Most of the flux applied to a board remains on the board after the solder contact. Thus, if the flux layer is thick, a test pin may not penetrate to establish conductive contact with an intended test point on the board, and a false open will be indicated. A long delay between soldering and inspection will allow flux to harden, and, if not removed, will particularly impede pin penetration.

Several types of soldering defects occur most frequently. A common defect is an incomplete or missing solder deposit where joining was intended, thereby causing an open. Another is bridging of solder between metalized portions on the board where joining was unintended, thereby causing a short. Still another is failure of the solder to fill a metallized hole in the board.

To eliminate post-soldering cleaning and false pin testing results, no-clean fluxes and special flux application techniques have been developed. A no-clean flux is a flux that after solder contact leaves a low level of residue which is noncorrosive and nonconductive. Preferably a no-clean flux contains little or no halide, but most preferably a non-corrosive, non-conductive organic acid dissolved in a solvent such as ethanol or isopropanol. Common RMA flux is a no-clean flux consisting of a mixture of rosin (abietic acid), activator (dimethylamine hydrochloride) and solvent (alcohol). Another no-clean flux is adipic acid (1% by weight) in ethyl or isopropyl alcohol. To avoid false pin test results, known as contact defects, no-clean flux desirably is applied in a thin layer. The following table shows the relationship between the thickness of an RMA flux layer and observed air atmosphere soldering and test contact defects. The data are from *Soldering In Electronics* by Wassink and Klein, 1984, page 235.

| Flux Thickness, microns | Contact Defects, per million joints | Soldering Defects, Type |
| --- | --- | --- |
| 15 | 3,333 | |
| 4 | 333 | bridging |
| 2 | 50 | bridging, poor hole filling |

The results indicate that as flux thickness is reduced, test contact defects decrease and soldering defects increase.

Conventional wave soldering machines are available which apply flux to a circuit board, preheat the board, contact the board with a molten wave of solder and then detach the board from the solder wave. The board is transported sequentially by a conveyer through these operations, which are performed in air. Typically the machine configuration comprises a fluxer, preheater and solder pot and conveyer mounted on a frame and enclosed by a liftable cover on a hinge. A slight vacuum is applied at a port at a central point in the cover to draw off objectional fumes emanating from these operations. Electrical controls which may be governed by a microprocessor are provided for various adjustments. More recently, wave soldering machines have been designed to flux, preheat and solder circuit boards in an inert or protective atmosphere. These machines provide benefits over machines which perform these operations in air as follows:

1. large reduction in the amount of solder oxides (dross) formed on the molten solder surfaces;
2. improved wetting of the solder on metal surfaces on a circuit board;
3. improved wicking of the solder into holes and through holes in the circuit board;
4. reduced open defects;
5. elimination of solder icicle formation;
6. capability of solderinq more closely spaced components and pads with acceptable bridging defect rates;
7. reduced amount of flux required;
8. reduced soldering machine cleaning and maintenance requirements; and
9. elimination of board cleaning after soldering, providing a minimal layer of no-clean flux was applied.

A protective atmosphere under which wave soldering is performed with the benefits mentioned comprises a non-oxidizing gas and not more than 5 percent oxygen, preferably not more than 100 ppm oxygen, and most preferably not more than 10 ppm oxygen. Nitrogen is a satisfactory non-oxidizing gas in which to perform the contacting with solder, and because of its low cost, nitrogen is a preferred non-oxidizing gas.

To achieve and maintain the protective atmosphere, the various operations are conducted in a long continuous enclosure or series of joined tunnels. Typical apparatus is described in U.S. Pat. No. 4,921,156 to Hohnerlein. The protective atmosphere is introduced into the tunnel enclosing the solder pot and flows out through the work entrance tunnel and the work egress tunnel. To restrict the escape of protective atmosphere, seal flaps are provided in the tunnels. The flaps are tilted open in the transport direction by a passing workpiece and close thereafter. Thus Hohnerlein's fluxing, preheating, solder attachment, detachment, and cooling are under a protective atmosphere.

Alternatively, gas jets have been used to form gas curtains and provide gas flow barriers at specific locations in tunnels as described in U.S. Pat. No. 4,538,757 to Bertiger.

Still another technique, described by Schouten in *Circuits Manufacturing*, September 1989 pages 51-53, has been to provide chambers in the entrance tunnel and the egress tunnel. Boards pass intermittently through the chambers which open and close. Within a chamber, when closed, a vacuum is drawn. The chamber is then filled and flushed with a protective atmosphere. This process is repeated allowing the oxygen content in the soldering zone to be kept below 10 ppm. The protective atmosphere used is nitrogen.

Many wave soldering machines designed for use in air are in operation in industry. Despite the benefits of soldering under a protective atmosphere, it is difficult for a circuit board manufacturer to justify the replacement of an existing machine designed to solder in air with a new machine designed to solder under a protective atmosphere. The operating savings that might be realized would take several years to off-set the cost of the new machine.

An alternative to a new soldering machine designed to solder in a protective atmosphere is to retrofit an existing machine so that it can be operated in a protective atmosphere Heretofore, wave soldering machines initially designed to solder printed circuit boards under a protective atmosphere have provided a protective atmosphere for all the functions of fluxing, preheating, contacting with solder, separation from solder and cooling of the board. It has been believed that a protective atmosphere for all these functions was necessary to achieve the benefits of soldering in a protective atmosphere as enumerated earlier. However, to provide a protective atmosphere for all these sections of a conventional air soldering machine is significant in terms of cost, additional complexity and retrofit time.

Thus there is a need for an apparatus for retrofitting an air soldering machine which minimizes the amount of additional installation required. A method and apparatus requiring a protective atmosphere only over the soldering portion of the machine itself would be very attractive.

It is an object of this invention to provide a method and apparatus whereby existing wave soldering machines originally designed to operate in air are retrofitted to obtain the benefits of soldering machines designed to operate under a protective atmosphere.

It is also an object of this invention to provide an economical design for new wave soldering machines initially intended to operate under a protective atmosphere.

It is a feature of this invention that only the solder pot and the immediate space over the solder pot need be provided with a protective atmosphere, allowing fluxing, preheating and cooling to be performed in air.

It is another feature of this invention that the protective atmosphere used may contain up to 5% oxygen in the solder contacting region.

It is an advantage of this invention that the retrofit of wave soldering machines designed to operate in air is economical and speedy to accomplish.

It is a further advantage that low soldering defect rates are achieved with reduced usage of flux which eliminates the need for cleaning of circuit boards after soldering.

It is another advantage of this invention that the protective atmosphere may be generated by separation of air by membrane or pressure swing adsorption, or by partial combustion of air.

SUMMARY OF THE INVENTION

The invention provides a hood to enclose and provide a protective atmosphere over the solder wave in the solder pot of a wave soldering machine while leaving the other operative areas exposed to a non-protective atmosphere. By non-protective atmosphere is meant any gas mixture having an oxygen concentration of, or oxidizing capability equivalent to, 5 volume percent or greater, an example being air. The hood has an opening for an inlet on one side and an opening for an outlet on another side for the passage of a circuit board conveyer over the solder wave. Optionally a short duct extending from a hood side may be provided for a hood inlet or outlet. The lower extremity of the hood fits around and is sealed on three sides to the upper extremity of the solder pot by an elastomeric seal. The remaining side of the hood carries an elastomeric seal and butts up against an upright bulkhead having its lower extremity immersed in the solder and sealed to the inside walls of the solder pot. The elevation of the pot is adjustable while the sealing is maintained. Also the pot and its bulkhead may be withdrawn laterally from under the hood.

Air is restricted from entering the inlet and outlet openings of the hood by curtains of thin solid material cut into vertical strips. The curtain material is electrically conductive to avoid the build up of static charge by rubbing on a circuit board as it passes through the curtain.

Protective atmosphere is introduced by one or more distributors under the hood. A preferred embodiment uses three gas distributors. One distributor is located directly over the solder wave and over the path of the conveyer. Another distributor is located on the forward side of the solder wave under the path of the conveyer. The third gas distributor is located on the rearward side of the solder wave under the path of the conveyer. The distributors are porous tubes of sintered metal allowing the protective gas to be introduced in a laminar flow.

Around the pump shaft which produces the solder wave is a cover with its lower extremity extending into the solder in the pot to form a seal. Outside the hood, over the inlet opening and the outlet opening are collector ducts for collecting the exhaust gas emanating from the hood through these openings. The process employs a no-clean flux and allows up to 5% oxygen content in the protective atmosphere. It produces low levels of soldering defects on circuit boards, low levels of pin testing defects and eliminates post-soldering cleaning of boards.

DESCRIPTION OF THE PREFERRED EMBODIMENTS

Figure 1:
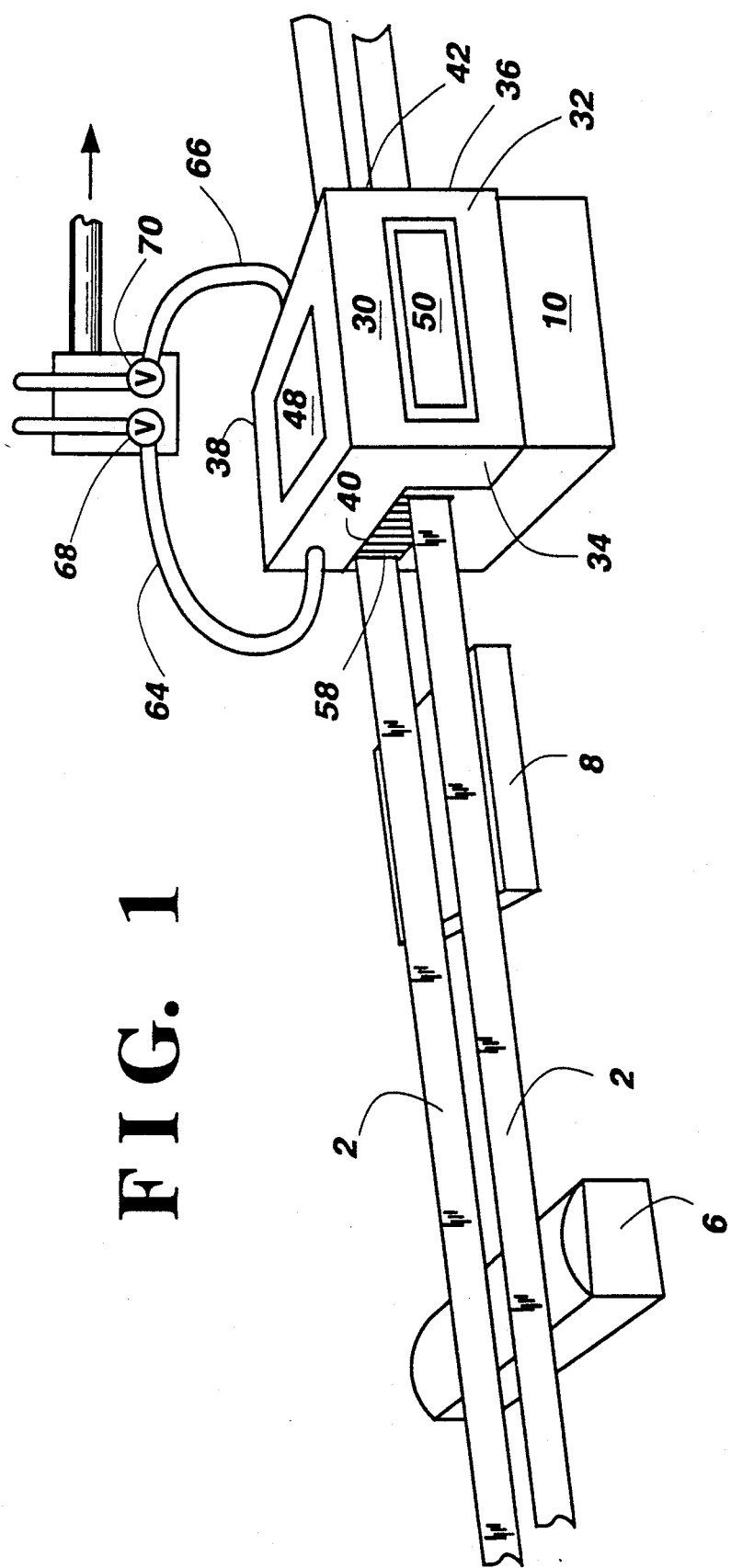
FIG. 1 is an overall view of a soldering machine equipped with the apparatus provided by this invention.
Figure 2:
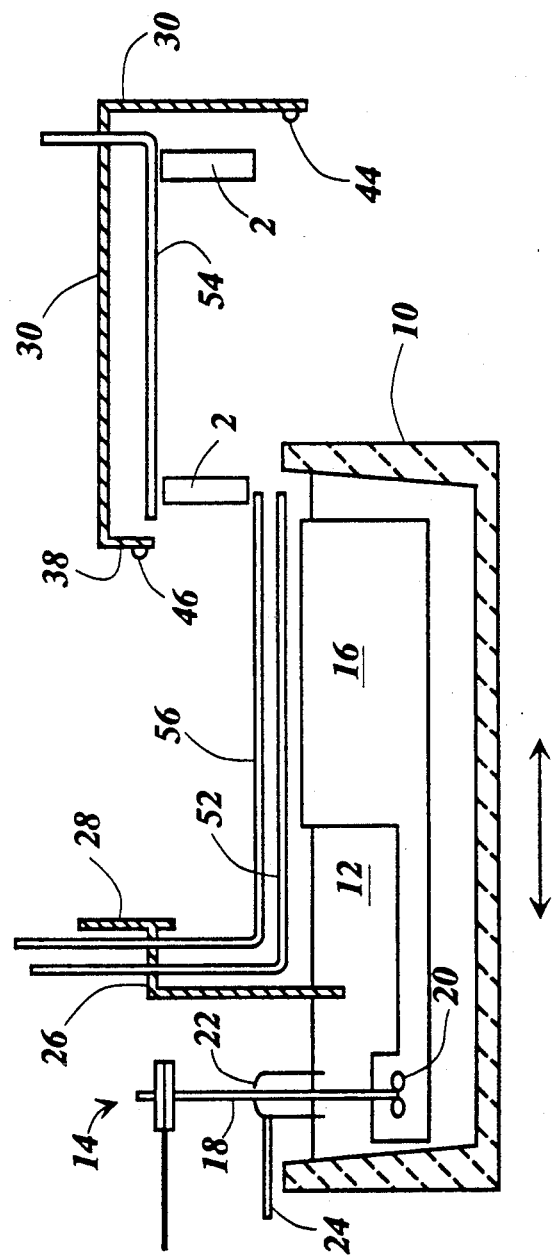
FIG. 2 is a side view of a cross-section taken through the center of the hood provided by this invention with the solder pot partially withdrawn from under the hood.
Figure 3:
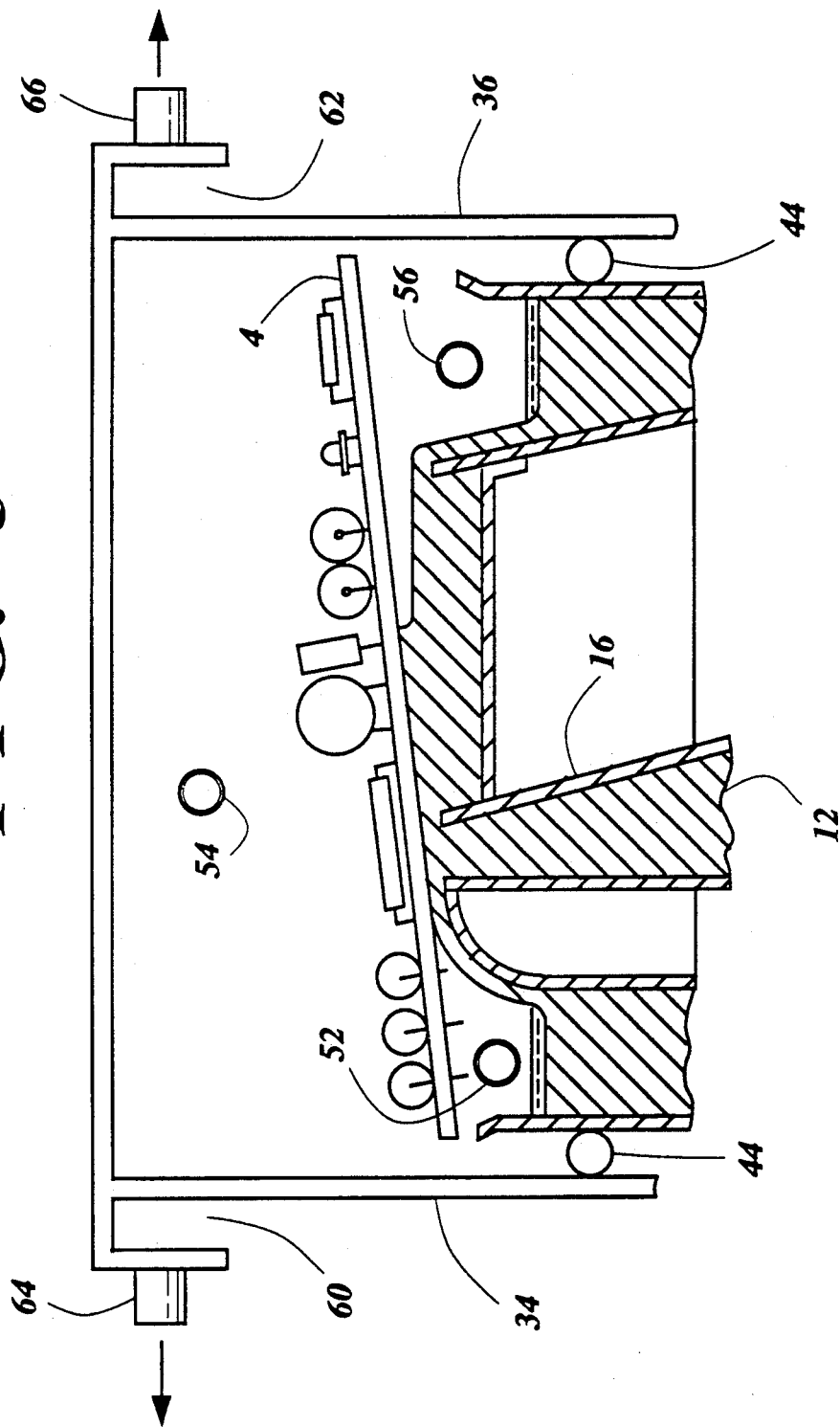
FIG. 3 is a front view of a cross-section of the hood and the upper portion of the solder pot.

Shown in the figures are the pertinent elements of a wave soldering machine equipped with a preferred embodiment of this invention. The machine comprises a frame (not shown) on which is mounted a conveyer 2 for transporting printed circuit boards 4. After being loaded with a circuit board, the conveyer carries the circuit board through a flux applicator 6 which is in an ambient air atmosphere.

Flux for use in this invention is no-clean flux. A preferred no-clean flux is 1% by weight of adipic acid dissolved in ethanol or isopropanol.

In practice, the flux is applied to the bottom of the board by common techniques to provide after the evaporation of solvents a layer with a thickness of 4 microns or less, preferably 2 microns or less. The use of a flux allows soldering materials with poor wetability and solderability, such as oxidized copper, and allows good filling with solder of plated or metallized holes in the circuit board. With the thin layer of no-clean flux used in this invention, cleaning of boards after soldering is unnecessary in most cases.

The conveyer 2 next passes the circuit board over a preheater 8 where the board is heated in an air atmosphere to a temperature between 70° C. and the melting point of the solder used. Typically the preheat temperature is 100° C. to 160° C. The flux solvent is evaporated upon reaching 70° C. in the preheater.

Next on the machine frame in the line of travel of the conveyer is an open solder pot 10 or tank. While the process is not limited to a given solder composition, a solder alloy typically used is 62.5% tin, 37% lead and 0.5% antimony by weight. Solder bath temperatures range typically between 190° and 300° C., most typically between 240° C. to 260° C.

The solder pot 10 has a generally rectangular or "L" shape when viewed from above. The pot contains molten solder 12, a means 14 for pumping the solder into a wave and a wave flow guide 16. The pumping means 14 comprises a shaft 18 partially immersed in the solder. The immersed portion of the shaft has an impeller 20 for pumping the molten solder. The unimmersed upper portion of the shaft is driven by a motor or by a belt. To prevent the ingestion of air into the solder around the pump shaft 18, the shaft is provided with an inverted cup-shaped cover. The lower, open portion of the cup is immersed in the solder to provide a seal. An inlet is provided for a protective atmosphere to be supplied under or into the cover. A small hole is also provided in the cover for the supplied gas to vent. An alternate solder pumping means is a magneto-hydrodynamic pump (not shown).

A vertical bulkhead 26 located towards the rear of the solder pot has its lower edge immersed into the solder. The bulkhead side edges which extend into the solder pot are sealed by an elastomeric material to the inside walls of the solder pot. The bulkhead has a vertical front extension 28.

Over the solder pot 10 is an enclosure or hood 30 for retaining a controlled or a protective atmosphere over the solder pot. The hood has a first or front side 32 facing where an operator usually would stand, a second or entrance side 34 facing the advancing conveyer, a third or exit side 36 facing the retreating conveyer and a fourth or rear side 38 opposite the front side 32.

On the entrance side 34 of the hood is an opening 40 for an entrance, and on the opposite or exit side 36 of the hood is an opening 42 for an exit. The conveyer for transporting circuit boards passes in an upward inclination through the entrance in the hood, over the solder wave and emerges through the exit in the hood. Optionally the entrance and/or exit for the boards may include a short duct (not shown) extending from the hood side.

The lower extremities of the front side 32, entrance side 34 and exit side 36, except for the conveyer entrance 40 and exit openings 42, fit around and are sealed to the outside upper extremities of the solder pot 10 by an elastomeric seal 44. The rear side 38 of the hood carries an elastomeric seal 46 and butts against the front vertical extension 28 of the bulkhead 26. The solder pot with the bulkhead is movable vertically without breaking the seals to adjust the elevation of the pot. The solder pot also can be withdrawn rearwards from under the hood to facilitate maintenance.

The top of the hood has a polycarbonate window 48 for viewing of the solder wave. One edge of the window is attached to a hinge allowing the window to be opened. Edges of the window when closed are sealed by an elastomeric gasket. The front side 32 of the hood also has a polycarbonate window 50 for viewing of the depth of solder contact by the circuit boards into the solder wave as they pass across the wave. Polycarbonate window material is selected for its lightness, non-breakability and machinability. The latter property allows the polycarbonate to be drilled to provide holes for attachment to supporting structure.

The useability of polycarbonate, which softens at a temperature of 140° C., is surprising considering the proximity of the polycarbonate window to the high temperature solder. While not wishing to be held to this explanation, the laminar introduction of protective atmosphere apparently results in low transfer of heat from the molten solder to the window.

Within the hood, the atmosphere is controlled. The attachment of a circuit board to the solder is performed in a protective atmosphere. A protective atmosphere is comprised of a non-oxidizing gas and not more than 5% oxygen by volume, preferably not more than 100 ppm oxygen and most preferably not more than 10 ppm oxygen. The non-oxidizing gas must have an oxygen content not greater than the oxygen level desired in the protective atmosphere. Preferably the non-oxidizing gas has not more than one-half the oxygen concentration desired in the protective atmosphere.

Nitrogen is a preferred non-oxidizing gas because of its low cost and availability. Other gases also useful for this purpose are carbon dioxide, argon, water vapor, hydrogen and other non-oxidizing gases and mixtures thereof. Optionally, gaseous formic acid or other reactive gas, i.e., other gaseous mono carboxylic acid, may be supplied with, or introduced into, the protective gas in concentrations of 10 ppm to 10% by volume, preferably 100 ppm to 1%, and most preferably 500 ppm to 5,000 ppm. The added reactive gas removes oxides which may not have been removed by the flux from the metalized portions of the board or the component leads. Additionally, such reactive gases allow a higher oxygen content in the protective atmosphere without deleterious effects. Thus nitrogen containing from 0.01 to 5% by volume of oxygen, as obtained from air by membrane separation, is usable to provide a protective atmosphere.

The detachment of the board from the solder is in a controlled atmosphere. Usually the detachment is performed in the same atmosphere as the attachment. However in some circumstances, such as to reduce undesired solder connections (bridging), the oxygen content may desirably be higher in the detachment region than in the attachment region.

Gas, to provide the desired atmosphere is preferably introduced under the hood through distributors in one, two or preferably three locations. The distributors are porous, sintered metal tubes having a diameter of 10 mm and a length approximately equal to the length of the hood inlet and outlet openings. They have a pore size of about 0.0005 mm to 0.05 mm, preferably 0.002 to 0.005 mm.

Each distributor extends horizontally normal to the direction of travel of the conveyer 2. The first distributor 52 in the direction of travel of a circuit board is located below the conveyer in front of the solder wave. The second distributor 54 is located over the conveyer over the solder wave. The third distributor 56 is located below the conveyer after the solder wave.

The two lower distributors 52, 56 are each cantilevered in a horizontal attitude from respective vertical gas supply tubes which enter through and are supported from the top of the bulkhead 26 and extend horizontally under the bulkhead extension 28. The depth of penetration of each gas supply tube is adjustable allowing each lower distributor to be positioned below the top edge of the solder pot and close to the solder surface. The upper distributor 54 is supported in a horizontal attitude by a gas supply tube entering the top of the hood.

With the hood enclosing only the solder pot, the hood is so short that the leading portion of a circuit board may contact the solder wave while the trailing portion protrudes from the entrance opening. Thus the first and second gas distributers 52, 54 mainly supply gases providing the atmosphere for the bottom and top of an entering board and attaching to the wave. Similarly, the leading portion of a board may protrude out of the exit opening while its trailing portion is in the solder wave. Thus the second and third distributors 54, 56 mainly supply gases providing the atmosphere for the top and bottom of a leaving board and detaching from the wave. This configuration allows different oxygen concentrations to be achieved during attachment to the molten solder and during detachment from the solder. Thus the oxygen concentration in the detachment region can be established independently at an optimum level to obtain a minimum bridging rate for a given flux composition and flux layer thickness. For example, RMA flux 3 microns thick yields low bridging rates with oxygen concentrations of 5 to 21%.

With a protective atmosphere over the solder surfaces, no oxide layer forms on the solder surfaces. Hence flowing solder surfaces forming the wave are susceptible to entrainment of hood gas as minute bubbles. The bubbles rise to the surface of the solder and burst releasing minute fragments of solder into the protective atmosphere. These fragments form minute spheres or balls, in the order of 0.2 to 0.5 mm in diameter, that travel throughout the atmosphere under the hood and deposit on all exposed surfaces. Periodic brushing removes the balls. Downward solder flows from the wave are provided with a guide or chute to reduce entrainment of gas into the solder.

Preferrably gas is supplied at a limited rate to issue from the distributors in a laminar flow. Laminar flow is considered to exist when the root mean square of random fluctuations in fluid velocity, as measured for example by a hot wire anemometer, do not exceed 10% of the average velocity. This criterion is desirably met not only by the flow emanating from the gas distributors, but throughout the entire hood space. The laminar flow provides a quiescent atmosphere which minimizes the entrainment of gas into the flowing solder surfaces and the infiltration of air through the hood openings.

Optionally a lower density gas may be supplied from the upper distributor (above the conveyer), and a higher density gas from the lower distributors (below the conveyer). The higher density gas will occupy the hood space mostly below the conveyer and the lower density gas the hood space mostly above the conveyer. Such use of gases of different densities reduces the infiltration of air into the hood allowing lower levels of oxygen concentration to be achieved with lower overall consumption of supplied gases.

The inlet and outlet openings 40, 42 to the hood are preferably rectangular and are provided with curtains 58 of a solid material to restrict air from entering the hood. The curtains are a thin, flexible material cut into vertical strips to minimize the drag forces exerted on the electrical components as they enter and exit through these openings. Preferred thicknesses range from 0.1 to 0.2 mm. Overly thin curtains are blown open by the exhaust flow. Overly thick curtains displace components from desired positions on the circuit board.

To avoid a build up of static charge by rubbing of the curtains on the circuit boards, the curtain material is electrically conductive and electrically grounded. A static charge may destroy the functionality of electrical components on the board.

In addition, the curtains do not shed fibers onto the circuit board, are resistant to chemical attack by the flux and solder fumes, are tolerant of temperatures to 265° C. and withstand physical brushing to remove the minute solder balls which deposit in the enclosed soldering environment. A suitable material is silicone rubber loaded with graphite fibers.

In the apparatus embodiment described, a circuit board detaches from the solder wave in a protective atmosphere and immediately begins to cool. Because of the shortness of the hood, a board leaving the wave quickly emerges from the exit opening in the hood and cools in air.

Using a low-residue, noncorrosive, nonconductive flux allows post-soldering cleaning to be obviated. Electrical inspection, as required, is performed upon the cooled boards with a low incidence of contact defects (false open measurements).

In view of the use of a short hood allowing a circuit board attaching or detaching from the solder wave to protrude through a hood opening, it is surprising that the benefits of protective atmosphere soldering are realizable, and particularly with reasonable supplied gas flows. This surprising result is attributed in varying degrees to the curtains, the supplied gas distributor configuration, the gas distributor locations, and the delivery of supplied gas in laminar flow.

A preferred embodiment includes an exhaust gas collector over the inlet opening to the hood and an exhaust gas collector over the outlet opening of the hood. The gas exhausting from the hood is preferably not allowed to escape into the solder machine environment, since, in most instances, it has insufficient oxygen for respiration and contains noxious flux fumes. A collector is a U-shaped duct with its opening facing the hood opening. Alternatively, a collector may comprise a tube with perforations facing the hood opening. Each collector leads to its own closed exhaust duct 64, 66 to carry away the collected exhaust gases. Optionally, collectors are additionally or exclusively provided along the bottoms of the hood openings.

In each exhaust duct is a valve 68, 70 to control the amount of exhaust gas which is collected by its corresponding collector. By adjusting the valves in the closed ducts leading from the collectors, the exhaust flow captured by each collector may be controlled. By this means the distribution of gas exhausting through the hood inlet opening and through the hood outlet opening may be controlled to a large degree. The adjustment of the valves in the exhaust ducts may be used also to counter a pressure distribution created outside one or both of the openings in the hood. Such a pressure distribution may be a draft created by a fan which may blow on, across, or away from one of the openings.

A soldering machine originally designed with fluxer, preheater and solder pot to operate in air usually has a liftable cover over these components. The cover usually is provided with at least one exhaust port maintained at a slight vacuum to draw off noxious fumes generated in these operations. Hence when a protective atmosphere hood is retrofitted over the solder pot, it is not obvious that exhaust collectors over the hood openings are desirable to remove the gas emanating therefrom. The exhaust in the machine cover often does not have sufficient capacity and is not appropriately located to withdraw the gas discharges from the hood.

The preferred embodiment includes several safety features. A safety shut-off valve operated by a solenoid is provided in the protective gas supply line. This shut-off valve is maintained closed under two conditions. One is when a contact switch senses that the top window on the hood is open. Another is when a differential pressure sensor determines that the pressure in the exhaust ducts is atmospheric and thus that no exhaust is being collected. In addition, the solder pump is controlled so that it cannot operate unless the supplied gas shut-off valve is open and protective gas is flowing into the hood.

In a hood configured pursuant to this invention, having inlet and exit openings 40.7 cm wide by 10.2 cm high obscured with strip curtains through which circuit boards were conveyed, 11 normal cubic centimeters per second of nitrogen (having not more than 10 ppm of oxygen) per square centimeter of hood opening distributed under the hood maintained oxygen concentration in the hood at 100 ppm. A normal volume of gas as used herein denotes an amount of gas equal to the volume of the gas at 25° C. and 1 atmosphere. Benefits of protective atmosphere soldering are achievable in hoods configured pursuant to this invention with non-oxidizing gas consumptions ranging from 5 to 50 normal cubic centimeters per second per square centimeter of hood opening.

With the curtains over the inlet and outlet openings, oxygen levels within the hood of and below 100 ppm are readily achieved. Without the curtains over the hood openings, an oxygen level of 100 ppm is still achievable, but the supplied gas consumption is higher.

EXAMPLE 1

A hood was fabricated and operated in accordance with this invention. The hood had entrance and exit openings each 40.7 cm wide by 10.2 cm high. The hood was purged with nitrogen with an oxygen content of about 1 ppm. The nitrogen was initially at room temperature and the solder wave was at 260° C. The oxygen level over the solder wave was measured versus nitrogen flow rate for different levels of uncurtained opening height. Uncurtained opening height is the distance from the bottom of the curtains to the bottom of an entrance or exit opening. The openings often have a significant uncurtained height in order to prevent the jostling of tall unstable parts.

An advantage of this invention is that low oxygen levels can be obtained even with relatively large uncurtained opening heights. Thus circuit boards with tall unstable parts can be processed without resorting to mechanical doors which must open and shut to prevent air infiltration.

Figure 4:
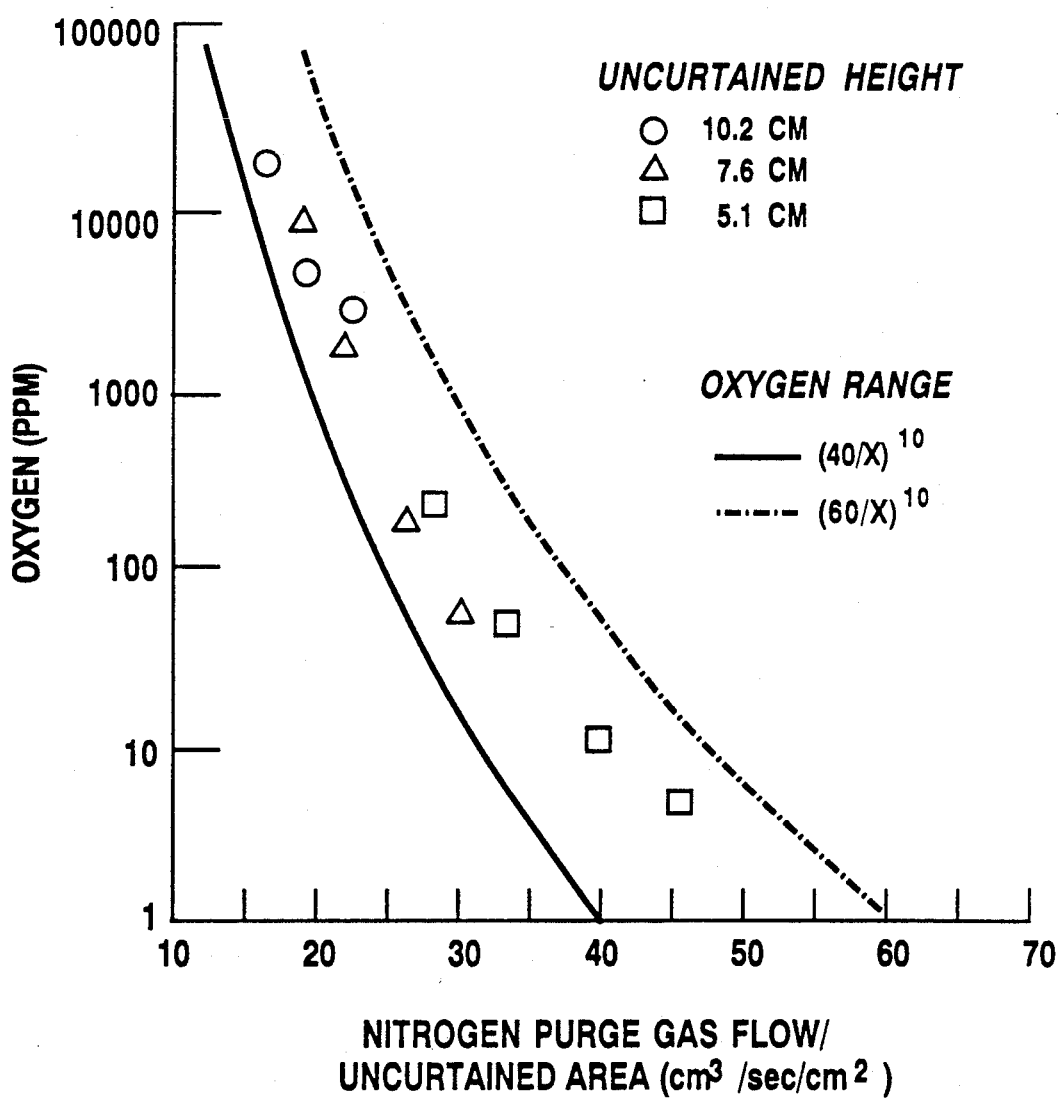
FIG. 4 is a graphical representation of the oxygen concentration in the protective atmosphere under a hood fabricated pursuant to this invention as a function of inert gas flow and uncurtained opening heights.

In order to limit oxygen levels in the hood to a desired maximum level, the non-oxidizing gas flow per unit area of uncurtained opening must have a certain minimum value. FIG. 4 shows the oxygen levels observed versus supplied gas flow per unit area of uncurtained opening for 3 different uncurtained heights 5.1 cm. The uncurtained heights were the same for the entrance and exit openings.

The lower limit and upper limit of oxygen levels observed in FIG. 4 are given by the following empirical relationships.

Lower limit ppm $O_2 = (40/x)^{10}$

Upper limit ppm $O_2 = (60/x)^{10}$ where

"x" is the flow per unit uncurtained area in normal cubic centimeters per second per square centimeter of uncurtained opening. By uncurtained opening is meant the total area of entrance and exit not covered by a curtain, plus any other uncurtained openings in the hood such as leakage opening. The numeric values "40", "60" and "10" are empirical parameters derived from the data.

The above empirical relationships can be rewritten to yield the following relationship for calculating the total flow required for a given hood.

Required gas flow $= AB(\text{ppm } O_2)^{-0.1} + C$

"Required gas flow" is the total nitrogen flow in normal cubic centimeters per second. "A" is a parameter that varies between 40 and 60. The units for "A" are normal cubic centimeters per second per square centimeter. "B" is the total uncurtained area in square centimeters. "Ppm $O_2$" is the difference between the maximum oxygen level desired at the solder wave and the oxygen content of the supplied gas. "C" is the nitrogen flow required when the uncurtained area is zero. "C" is about 2,000 normal cubic centimeters per second for reasonably tight hoods.

The values for "A" and "C" given above are suitable for all gases with a density within 10 percent of that of nitrogen. Low density gasses such as hydrogen will have larger values for the parameters "A" and "C". High density gases such as carbon dioxide and argon will have lower values by about one-half for the parameters "A" and "C".

An alternative method for estimating the gas flow required when the uncurtained area is small or is not known is to use the relationship:

Flow required = E (total opening area)

"E" is an empirical parameter. For nitrogen and gases with a density within 10% of nitrogen, "E" has a value between 5 and 50 $cm^3/sec/cm^2$. "E" preferably is in the range of 8 to 20 $cm^3/sec/cm^2$. "Total opening area" is the sum of the curtained and uncurtained area of both the entrance and exit and any other opening.

Low density gases such as hydrogen will have larger values for "E". High density gases such as carbon dioxide and argon will have lower values by about one-half for the parameter "E".

Another alternative method for estimating the gas flow required when the opening area is not known is:

Flow required = F

"F" is an empirical parameter. For nitrogen and gases with a density within 10% of nitrogen, "F" has a value between 4,000 and 40,000 $cm^3/sec$. "F" preferably is in the range of 7,000 to 16,000 $cm^3/sec$.

Low density gases such as hydrogen will have larger values of "F". High density gases such as carbon dioxide and argon will have lower values by about one-half for "F".

EXAMPLE 2

Circuit boards with 120 closely spaced potential bridging sites were fluxed with a spray fluxer. The applied flux was Hi-Grade 784 manufactured by Hi-Grade Alloy Corp, East Hazelcrest, Ill. Hi-Grade 784 is an RMA flux which leaves noncorrosive and nonconductive residues. The amount of flux applied to the circuit boards was controlled by varying the duration of the spray. The thickness of the flux was calculated from the weight of the flux deposited on the circuit board and the density of the flux (0.8 gm/cc). The circuit boards were then passed over a preheater which heated them to about 70° C. in the air.

The boards then entered a solder pot hood with a general configuration as described earlier. The hood had inlet and exit openings 40.7 cm long by 10.3 cm high. Extending normally from each hood opening for 25 cm and integral with the hood was a sheet metal duct with cross section identical to the opening. At the end of each duct completely covering its opening was a curtain of the type previously described.

In these tests, however, only two gas distributors were used. One distributor was located over the solder wave and admitted 8 normal liters per second of nitrogen containing not more than 10 ppm oxygen. This distributor maintained the oxygen concentration in the attachment region at 100 ppm during all tests. Another distributor was located on the downstream side of the wave under the board conveyer and admitted 1.57 normal liters per second of nitrogen containing levels from 0.01% to 20% oxygen as desired in the several test runs. A sheet metal deflector directed this flow at the region where boards detached from the solder wave. A probe in this detachment region measured the oxygen concentration. After detachment from the solder, boards emerged through the exit opening in the hood and cooled in air.

The top of the hood had a polycarbonate window above the solder wave for viewing the wave. The window did not soften or sag. Its outside temperature was about 60° C.

Figure 5:
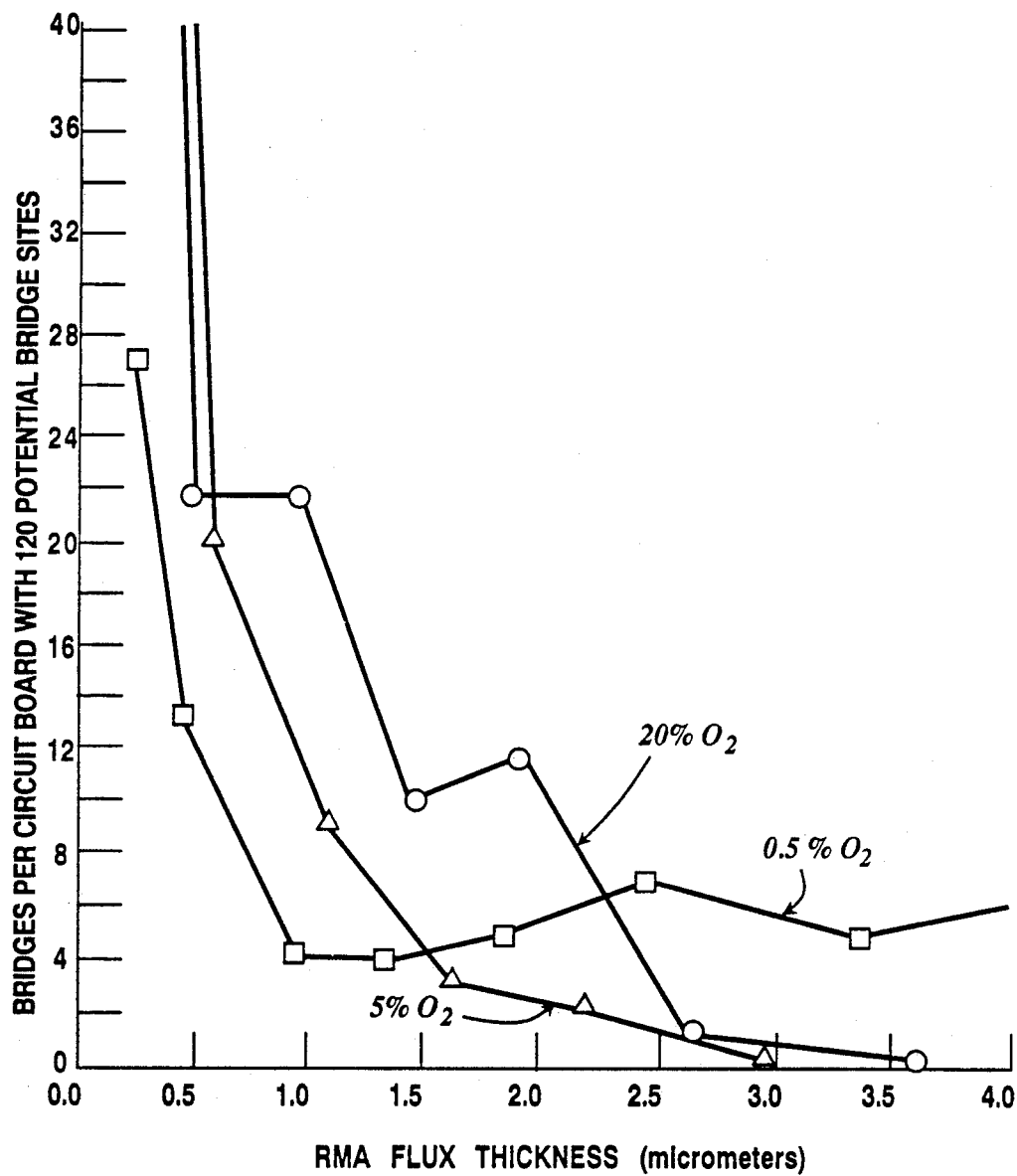
FIG. 5 is a graphical representation of the effect upon solder bridging of oxygen concentration in the zone of detachment of the workpiece from molten solder.

Results of the tests are depicted graphically in FIG. 5. With a flux thickness of 1 micron, bridging rates of 4 per board at 0.5% oxygen in the detachment zone, 8 per board at 5% oxygen and 22 per board at 20% oxygen were obtained.

However, with a flux thickness of 2.5 microns or greater, very low bridging rates of one per board were obtained with oxygen concentrations in the detachment zone of 5% and 20% oxygen. A higher, but moderate bridging rate of 6 per board was obtained with an oxygen concentration of 0.5% in the detachment zone.

For all three of these oxygen concentrations tested, the number of open defects including unfilled holes was zero per board. With the low RMA flux thickness used of 2.5 microns, the rate of contact defects expected in electrical testing was low.

Similar experiments without any flux produced a bridging rate of 7 per board, several open defects per board and poor hole filling. Similar experiments using 1% adipic acid in ethyl alcohol, applied to produce a flux layer of about 2.5 microns, yielded a bridging rate of one per board, no opens and good hole filling for oxygen concentrations in the detachment zone of from 3 ppm to 20%.

Hence the instant process and apparatus, using modest thicknesses of no-clean flux, allows wave soldering with minimal rates of soldering and contact defects, elimination of cleaning, moderate consumption of protective atmsophere gas and low apparatus cost.

Although the invention has been described with reference to specific embodiments as examples, it will be appreciated that it is intended to cover all modifications and equivalents within the scope of the appended claims.

What is claimed is:

1. A hood for installation on the upper extremity of a solder pot, said hood for containing a protective atmosphere during contacting of circuit boards with a solder wave in the pot, said hood comprising an enclosure over at least a portion of the solder pot and having an entrance for circuit boards on a first or entrance side and an exit for circuit boards on a second or exit side, means for admitting gas into said hood, and means for sealing said hood to the solder pot comprising:

(a) The lower extremities of said entrance and exit sides and a front side of said hood being shaped to fit around the upper extremity of the solder pot;

(b) a bulkhead for vertical positioning in the solder pot with its lower extremity immersed in the solder and lower extremity edges sealed to the inside sides of the solder pot;

(c) a rear side of the hood for butting against the vertical bulkhead;

whereby the solder pot elevation is adjustable relative to the hood, and the solder pot is withdrawable from under the hood by rearward translation.

2. The invention as in claim 1 wherein said means for sealing said hood to said solder pot further comprises a first elastomeric seal on the inside surfaces of the lower extremities of the front, entrance and exit sides of the hood, said first elastomeric seal for contacting the upper outside surfaces of the solder pot, and a second elastomeric seal on the outside surface of the rear side of the hood for contacting the bulkhead.

3. A hood for installation on the upper extremity of a solder pot, said hood for containing a protective atmosphere during contacting of circuit boards with a solder wave in the pot, said hood comprising an enclosure over at least a portion of the solder pot and having an entrance for circuit boards on a first or entrance side and an exit for circuit boards on a second or exit side, means for admitting gas into said hood, means for sealing said hood to the solder pot, and means for restricting the entrance of atmospheric air into at least one of said entrance and said exit, said restricting means comprising a curtain of thin solid material cut into vertical strips.

4. The invention as in claim 3 wherein said curtain material over said inlet opening is electrically conductive and grounded.

5. The invention as in claim 3 wherein said curtain material has a thickness in the range of 0.1 to 0.2 mm.

6. The invention as in claim 3 wherein said curtain is comprised of silicone rubber loaded with graphite fibers.

7. The invention as in claim 3 wherein at least one of said entrance and exit further comprises a duct having a first end covering an opening in said entrance or exit side, said duct extending from said hood side to a second end for the passage of circuit boards.

8. The invention as in claim 3 wherein said material is flexible.

9. A hood for installation on the upper extremity of a solder pot, said hood for containing a protective atmosphere during contacting of circuit boards with a solder wave in the pot, said hood comprising an enclosure over not more than the solder pot and having an entrance for circuit boards on a first or entrance side and an exit for circuit boards on a second or exit side, means for sealing said hood to the solder pot, means for admitting gas into said hood and an exhaust collector duct with a collector positioned adjacent to said entrance and an exhaust collector duct with a collector positioned adjacent to said exit so as to collect exhaust gas emanating from said hood through said entrance and exit and prevent its escape into the hood environment, each exhaust collector duct having means for flow control, whereby the distribution of gas exhausting through said entrance and through said exit may be controlled.

10. The invention as in claim 9 wherein at least one of said entrance and exit further comprises a duct having a first end covering an opening in said entrance or exit side, said duct extending from said hood side to a second end for the passage of circuit boards.

11. A hood for installation on the upper extremity of a solder pot, said hood for containing a protective atmosphere during contacting of circuit boards with a solder wave in the pot, said hood comprising an enclosure over at least a portion of the solder pot and having an entrance for circuit boards on a first or entrance side and an exit for circuit boards on a second or exit side, means for sealing said hood to the solder pot and means for admitting gas into said hood comprising a gas distributor cantilevered in a horizontal position from a vertical gas supply tube supported from a bulkhead attached to the solder pot.

* * * * *